US005590239A

United States Patent [19]
Resnick et al.

[11] Patent Number: 5,590,239
[45] Date of Patent: Dec. 31, 1996

[54] PLANAR UNIFORM HEATING SURFACE WITH ADDITIONAL CIRCUMSCRIBING RING

[75] Inventors: Douglas J. Resnick, Phoenix; William A. Johnson, Paradise Valley; Kevin D. Cummings, Phoenix, all of Ariz.; Hector T. H. Chen, Madison, Wis.

[73] Assignee: Motorola, Schaumburg, Ill.

[21] Appl. No.: 254,845

[22] Filed: Jun. 6, 1994

[51] Int. Cl.⁶ .................. H05B 1/00; G21K 5/00
[52] U.S. Cl. .......... 392/418; 219/521; 219/443; 378/35; 430/5; 437/962
[58] Field of Search .................. 392/418, 416; 219/521, 455, 457, 458, 459, 464, 443; 118/728, 500, 724, 725; 378/34, 35; 430/5; 427/504, 552; 437/931, 948, 962

[56] References Cited

U.S. PATENT DOCUMENTS

| | | |
|---|---|---|
| 2,445,086 | 7/1948 | Rodwick .................. 219/457 |
| 2,583,705 | 1/1952 | Peterson .................. 219/457 |
| 3,025,378 | 3/1962 | Sadell .................. 219/521 |
| 3,764,511 | 10/1973 | Glick et al. .................. 118/728 |
| 4,113,547 | 9/1978 | Katz et al. .................. 118/728 |
| 4,233,934 | 11/1980 | Anthony et al. .................. 118/500 |
| 4,518,848 | 5/1985 | Weber .................. 219/388 |
| 4,628,991 | 12/1986 | Hsiao et al. .................. 165/170 |
| 4,906,821 | 3/1990 | Bechevet et al. .................. 219/521 |
| 5,034,688 | 7/1991 | Moulene et al. .................. 219/521 |
| 5,329,097 | 7/1994 | Jones et al. .................. 219/459 |
| 5,476,548 | 12/1995 | Lei et al. .................. 118/728 |

*Primary Examiner*—John A. Jeffery
*Attorney, Agent, or Firm*—Gary F. Witting; Eugene A. Parsons

[57] ABSTRACT

A uniform heating fixture and method of use is provided. A heat conductive member having a first plane surface, a second surface and a third plane surface is formed. The first plane surface and the third plane surface are parallel and are connected by a second surface. The third plane surface circumscribes and extends away from the first plane surface, thereby enabling uniform heating of an X-ray mask.

13 Claims, 3 Drawing Sheets

PLANAR UNIFORM HEATING SURFACE WITH ADDITIONAL CIRCUMSCRIBING RING

BACKGROUND OF THE INVENTION

This invention relates, in general, to semiconductor processing, and, more particularly, to X-ray lithography.

Recently, there has been increased interest in X-ray lithography as demands for continually smaller features increase. Additionally, this interest has been further extenuated as it becomes increasingly hard to provide these small images or features with optical photolithography. Use of X-ray lithography potentially has several advantages, such as being able to image smaller features, higher lithographic performance, and is potentially more manufacturable.

While these advantages are theoretically possible, conventional baking processes used in the manufacture of X-ray masks do not allow these advantages to be realized across an imaging field of the X-ray mask.

Conventionally, during the manufacture of X-ray masks, baking processes generally are achieved by either a convection baking process or a hot plate baking process. In the convection baking process, a convection oven is used. The X-ray mask is placed in the convection oven and baked for a prescribed period of time. However, convection ovens are not capable of precise temperature control due to a variety of factors, such as a large volume, movement of convection currents of air in the oven, poor control systems, or the like, thus making the convection oven process not suitable for baking of X-ray mask. In the hot plate baking process, a hot plate is used. The X-ray mask is placed on the hot plate and baked for a prescribed period of time. However, while the hot plate baking process is better than the convection oven baking process, the conventional hot plate baking process is not sufficient for precise baking of X-ray masks. Thus, neither the hot plate baking process nor the convection process allows for precision baking of X-ray masks so as to be able to image fine lines and spaces of equal uniformity across the entire chip field of an X-ray mask.

It can be seen that use of conventional baking processes does not meet the requirements for today's manufacturing of X-ray masks. Therefore a baking process that is precise enough to allow imaging of extremely small lines and spaces of equal uniformity across the entire chip field would be highly desirable.

SUMMARY OF THE INVENTION

Briefly stated, a uniform heating fixture and method of use is provided. A heat conductive member having a first plane surface, a second plane surface and a third plane surface is formed. The first plane surface and the third plane surface are parallel and are connected by a second plane surface. The third plane surface circumscribes and extends away from the first plane surface, thereby enabling uniform heating of an X-ray mask.

DETAILED DESCRIPTION OF THE DRAWINGS

DETAILED DESCRIPTION OF THE DRAWINGS

Figure 1:
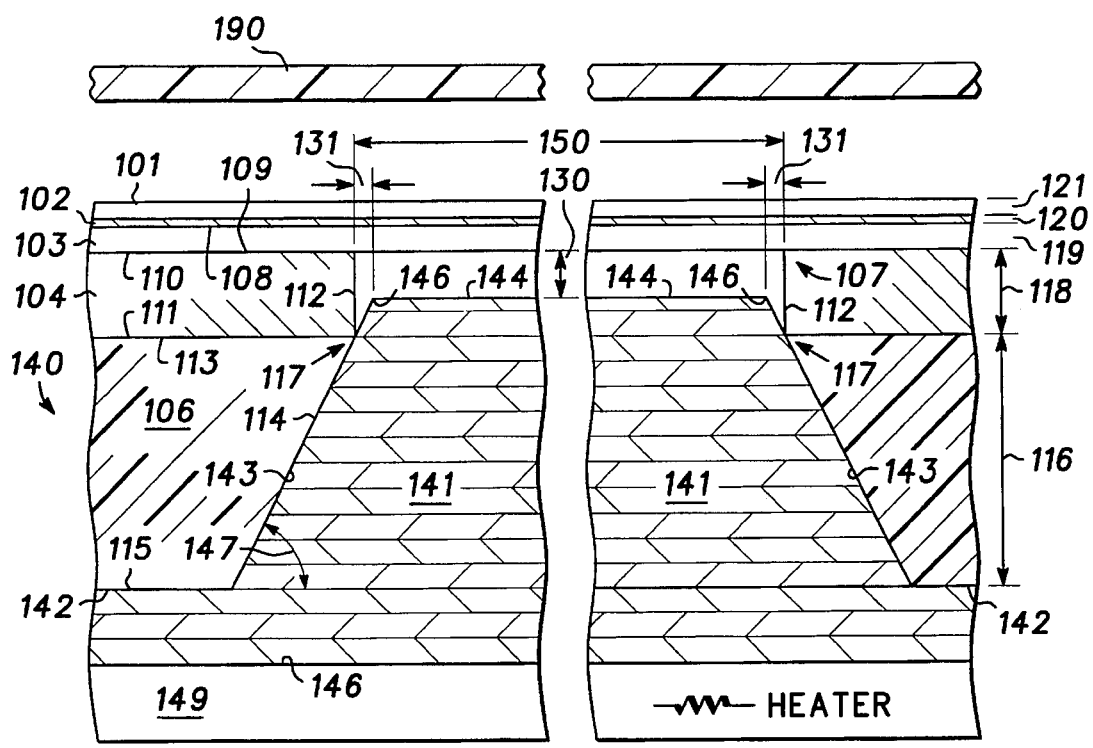
FIG. 1 is a simplified cross-sectional view, with portions removed, of an embodiment of an X-ray mask heating fixture.
Figure 2:
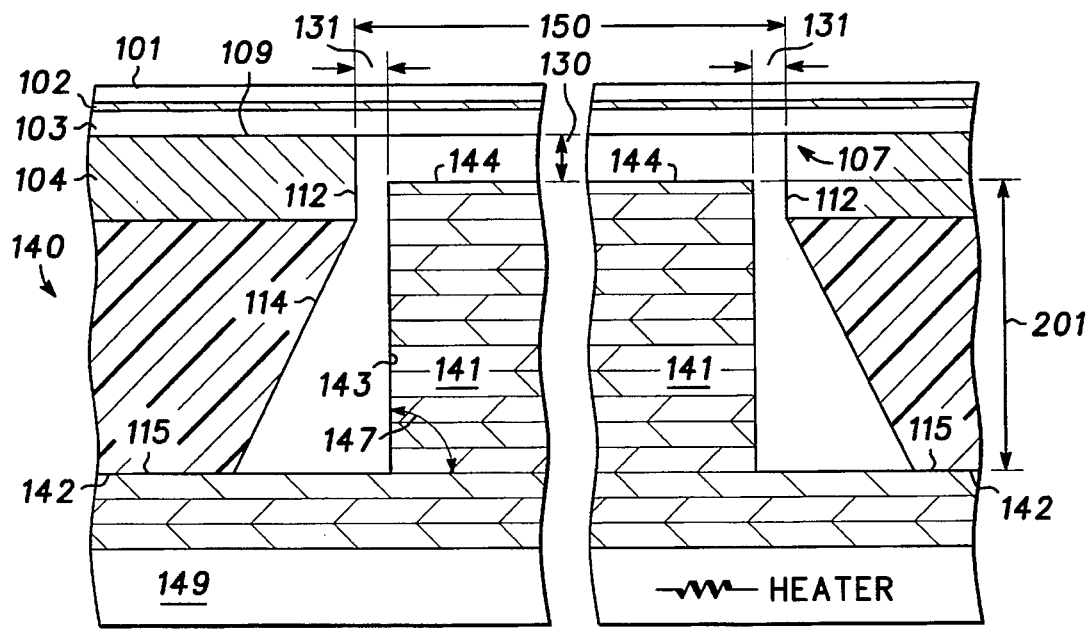
FIG. 2 is a simplified cross-sectional view of an embodiment of an X-ray mask heating fixture, with portions thereof removed.
Figure 3:
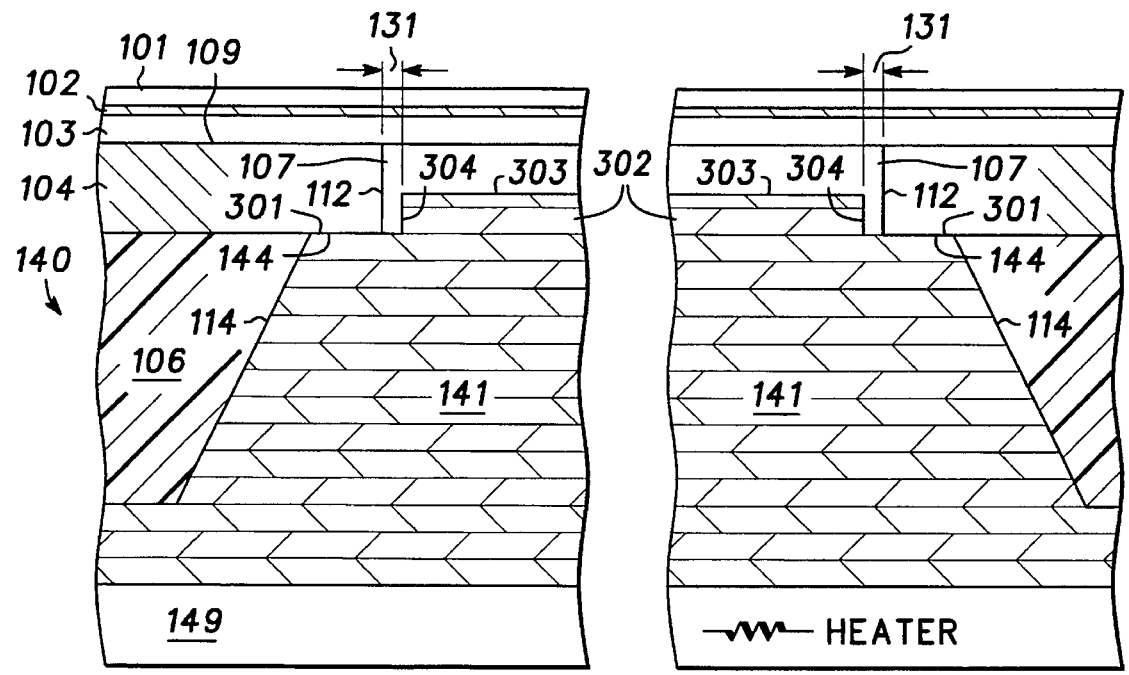
FIG. 3 is yet another embodiment of an X-ray mask heating fixture, with portions thereof removed.

FIG. 1 shows an X-ray mask 100 and a uniform heating fixture 140 in a simplified cross-sectional view, with portions broken away. Additionally, in FIGS. 1, 2, and 3, X-ray mask 100 is shown having similar elements, although not necessarily the same. It should be understood that since FIGS. 1, 2, and 3 are cross-sectional views, thus FIGS. 1, 2, and 3 can extend into and out of the drawing. X-ray mask 100 is shown having several elements or features, such as E-beam sensitive layer 101, a plating base layer 102, a membrane 103 having surfaces 108 and 109, support ring 104 having surfaces 110, 111 and 112, and support ring 106 having surfaces 113, 114, and 115. Support ring 106 is made of any suitable material, such as silicon dioxide, silicon carbide, or the like. However, in a preferred embodiment, support ring 106 is made of a silicon dioxide, known as Pyrex. Generally, support ring 106 is prefabricated in a ring shape, thus making support ring 106 ready for bonding. While physical sizes of support ring 106 generally are determined by a receptacle in an X-ray exposure system in which the X-ray mask is used, support ring 106 ranges in a thickness 116 from 2.0 to 10.0 millimeters with a preferred range from 4.00 to 4.50 millimeters and with a nominal thickness of 4.29 millimeters. Also, the size of an opening 117, defined within ring 106, is influenced by the receptacle in the X-ray exposure system. Thus, depending upon the X-ray exposure system, opening 117 sizing is set at any suitable size. However, at present, opening 117 ranges from 20.0 to 75.0 millimeters, with a nominal size of 40.0 millimeters.

Support ring 104 is made of any suitable material such as silicon, silicon carbide, or the like. In a preferred embodiment, silicon is used in a form of a silicon wafer. Typically, the silicon wafer (portion thereof illustrated) is used for starting materials so as to make support ring 104. Typically, the silicon wafer is bonded to support ring 106 by any suitable means well-known in the art. Membrane 103 is then formed on the bonded wafer. Alternatively, before bonding of support ring 106 to the silicon wafer, the silicon wafer is processed to form a membrane 103. Generally, thickness 118 of the silicon wafer can range from 300.0 micrometers to 700.0 micrometers, with a preferable range from 325.0 to 400.0 micrometers, and with a nominal thickness of 375 micrometers.

Membrane 103 is made of any suitable material that is transparent to X-rays, such as silicon nitride, silicon carbide, diamond, or the like. In a preferred embodiment, a nitride film is used to form membrane 103. Thickness 119 of membrane 103 can range from 1.0 micrometer to 3.0 micrometers, with a preferable range from 1.5 to 2.5 micrometers, and with a nominal thickness 119 of 2.0 micrometers.

Absorbing layer 102 is made by any suitable method, such as plating technologies or substractive technologies that are well-known in the art. Absorbing layer 102 is made of any suitable material, such as a metal, e.g., gold, tungsten, tantalum, or an alloy, e.g., titungsten, or a layered material, e.g., titanium with a cap of gold. Thickness 120 is application specific and is determined by the blocking characteristics of the material selected, as well as subsequent processing. However, thickness 120 of absorbing layer 102 typically ranges from 2,000 to 9,000 angstroms, with a preferable range from 3,000 to 6,500 angstroms with a nominal thickness 4,000 angstroms. Generally, thickness 120 is selected on resolution considerations that allow precise and accurate image transfer into an X-ray resist.

E-beam sensitive layer 101 is made of any suitable material, such as negative resist materials, positive resist materials, and the like. In a preferable embodiment, a negative resist material is used that is chemically amplified. More specifically, the negative resist material is SAL-601-ER7 from Shipley Company of Newton, Mass. Thickness 121 of E-beam sensitive layer 101 is any suitable thickness depending upon specific material selected. Generally, thickness 121 of E-beam sensitive layer 101 ranges from 9,000 to 2,000 Angstroms, with preferable range from 6,500 to 4,500 Angstroms, with a nominal thickness 121 of 5,500.

By way of example only, with support ring 106 being a preformed Pyrex ring, with support ring 104 being made of silicon, and with membrane 103 being made of silicon nitride, a silicon wafer having a surface is processed so that a silicon nitride film or layer is deposited on the surface of the silicon wafer. The preformed Pyrex ring is then bonded to the silicon wafer, wherein the bonding of the Pyrex ring is on a side opposite the silicon nitride which will become membrane 103. After bonding of the preformed Pyrex ring to the silicon wafer, the bonded silicon wafer and Pyrex ring are subjected to a silicon etch which removes an exposed silicon portion opposite to that of the silicon nitride. The silicon etch is continued until opening 107 is formed, thereby exposing a portion of surface 109 of membrane 103, thus forming an X-ray mask blank. Subsequently, the X-ray mask blank is further processed to form an X-ray blocking layer.

Uniform heating fixture 140 includes a member 141 with surfaces 142, 143, 144, and 146. Any suitable material is used to form uniform heating fixture 140 so that heat is conducted throughout uniform heating fixture 140. Typically, metal materials and their alloys, such as aluminum and stainless steel, and the like are used to make uniform heating fixture 140. Surfaces 142, 143, 144, and 146 are formed by any suitable method, such as milling, casting, combining both milling and casting, or the like.

Additionally, uniform heating fixture 140 further includes a heating device 149. Heating device 149 is made of any suitable apparatus, including but not limited to, a radiant heater, a photonic heater, embedded heating coils, and the like. It should be understood that any heating device applied either directly or indirectly to uniform heating fixture 140 is capable of being used. Further, a cover 190 was placed over uniform heating structure 140 that contained X-ray mask 100 so that stray currents of air would not effect heat distribution or uniformity across membrane 103.

As shown in FIG. 1, X-ray mask 100 positioned on uniform heating fixture 140, forms a gap or space 130. Gap or space 130 is formed with a distance between surface 144 of uniform heating fixture 140 and surface 109 of membrane 103. In the present invention, the distance of space 130 ranges from less than or equal to 1.0 millimeters, thereby providing improved heat distribution and improved heat uniformity across a membrane field 150 of X-ray mask 100. As a result of this improved heat distribution and improved heat uniformity, subsequent heat dependent processes, such as lithographic processing, alloy processing, and the like are enhanced or improved.

Further, as also illustrated in FIG. 1, gap or space 131 is defined by corner 146 of uniform heating fixture 140 and surface 112 of support ring 104. Space 131 has a distance that is dependent on an angle 147 of uniform heating fixture 140 and distance of space 130. Since angle 147 is arbitrarily fixed by the X-ray exposure system and since space 130 needs to be 1.0 millimeter or less, space 131 reduces a usable chip field size by space 131 across membrane field 150. However, even with these limitations, heating uniformity of membrane 103, is much improved over conventional X-ray mask baking procedures as demonstrated in FIG. 6. Additionally, while FIG. 1 shows surface 115 of support ring 106 resting on surface 142 of member 141, it should be understood that while it improves the heating uniformity of membrane field 150 of membrane 103, it is not necessary for improvements in heating uniformity; however, it should also be understood that, in this particular embodiment, having at least a portion of surface 114 of support ring 106 coupled or in contact with surface 143 of uniform heating fixture 140 does significantly improve heating uniformity of membrane field 150 of membrane 103.

FIG. 2 illustrates another embodiment of uniform heating fixture 140 with X-ray mask 100 in a simplified cross-sectional view. It should be understood that similar features identified in FIG. 1 will retain their original identifying numerals.

As shown in FIG. 2, by making angle 147 approximately ninety degrees, spaces 131 is now controlled by inserting or fitting of surfaces 143 of uniform heating fixture into opening 107 of support ring 104, thereby enabling reduction of the distance of space 131, enabling greater control of uniform heating, and enabling uniform heating of a larger membrane field 150. Further, as illustrated in FIG. 2, since uniform heating fixture 140 no longer rests on surfaces 114 of support ring 106, a height 201 defined by surface 142 and 144 of uniform heating fixture 140 is adjustable to further reduce the distance of space 130 without affecting the distance of space 131. It should be understood that by bringing surface 112 of support ring 104 and surface 143 of uniform heating structure 140, as well as by bringing surface 144 of uniform heating fixture 140 and surface 144 and surface 109 exposed through opening 107 of support ring 104 improves uniform heating and increases usable chip field area 150.

Additionally, as shown in FIG. 2, surface 115 and surface 142 of support ring 106 and of uniform heating fixture 140, respectively, are in contact, thereby increasing uniformity of heat distribution through membrane 103. However, while it is shown that surface 115 and surface 142 are in contact, by having surfaces 112 and 143 of support ring 104 and uniform heating fixture 140 along with surfaces 144 and 109 of uniform heating fixture 140 and membrane 103 close to each other, enhanced uniformity of heating of exposed surface of membrane 103 through opening 107 is achieved. Typically, enhanced uniformity is dependent on distances of space 130 and 131. The distances of spaces 130 and 131 are in a range of from 1.0 millimeter and less FIG. 3 illustrates yet another embodiment of uniform heating fixture 140 with X-ray mask 100 in a simplified cross-sectional view. It should be understood that similar features identified in FIGS. 1 and 2 will retain their original identifying numerals.

As shown in FIG. 3, by retracting surface 114 of support ring 106, surface 301 of support ring 104 is exposed. So as to maximize uniformity of heating, uniform heating fixture 140 is formed with an extension or pillar 302 that extends into opening 107 formed in support ring 104. Additionally, by projecting pillar 302 into opening 107, surface 304 is formed so that surface 112 of support ring 104 and surface 304 are as close as possible, thereby making the distance of space 131 as small as possible. Typically, space 131 in this particular embodiment of the present invention has a range of 1.0 millimeter or less, thus maximizing usable membrane field 150. Additionally, surface 144 of uniform heating fixture 140 is formed to enable surface 301 to contact or couple with said surface 144, thus generating a more uniform heat distribution through membrane 103.

Figure 4:
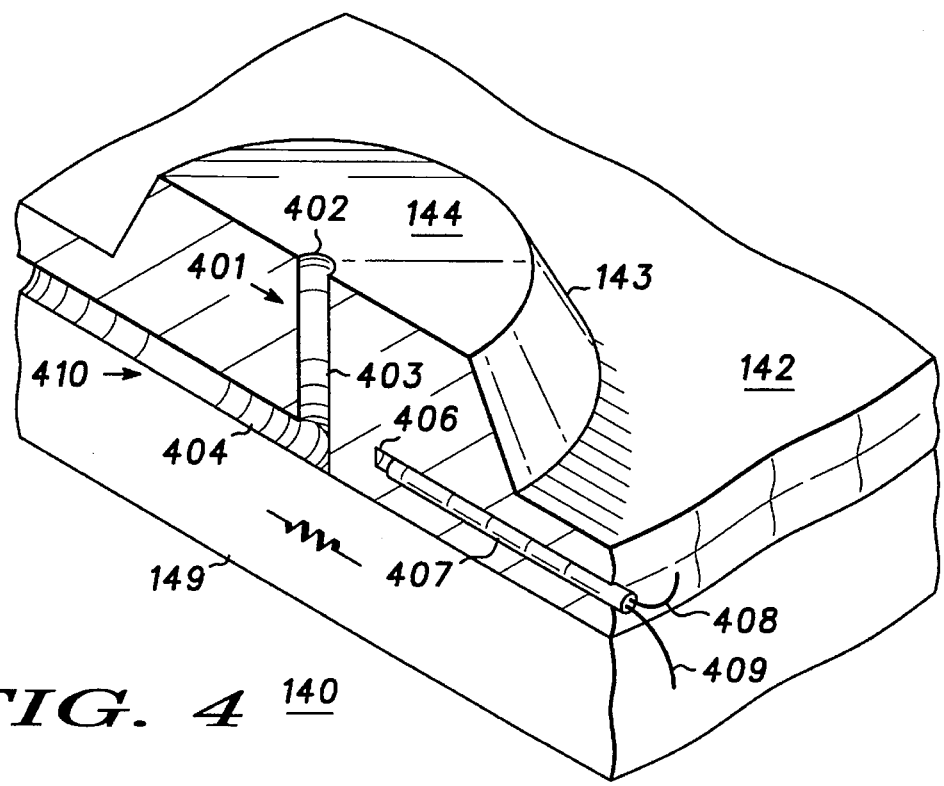
FIG. 4 is a greatly simplified isometric view of an X-ray mask heating fixture, with portions thereof removed and showing a sectional view.

FIG. 4 illustrates a simplified isometric view of an embodiment of a uniform heating fixture 140, with portions thereof removed, and shown in section. It should be understood that similar features identified in FIGs. hereinabove will retain their original identifying numerals. Generally, as is seen in FIG. 4, surface 144 is shaped circularly with surface 143 extending downward to surface 142, with surface 142 being parallel with surface 144 and extending away from surface 144 of uniform heating fixture 140.

In section 410, inner working details are observed, such as vent apparatus 401 having an opening 402, a shaft 403 and a shaft 404. Additionally, a bore 406 is shown with a thermocouple 407. Thermocouple 407 is further illustrated with leads 408 and 409 which are used to electrically connect thermocouple 407 to electronics (not shown) for monitoring of temperature.

Vent apparatus 401 is used to facilitate placing and removing of X-ray mask 100 as shown hereinbefore, thus reducing possible damage to membrane 103 during placement or removal of X-ray mask 100. Generally, opening 402 is formed in surface 144 and is continued to form shaft 403. Shaft 404 is made to communicate with shaft 403, thus providing an atmospheric vent for uniform heating fixture 140, thus allowing pressure and vacuum to be vented to the atmosphere.

Figure 5:
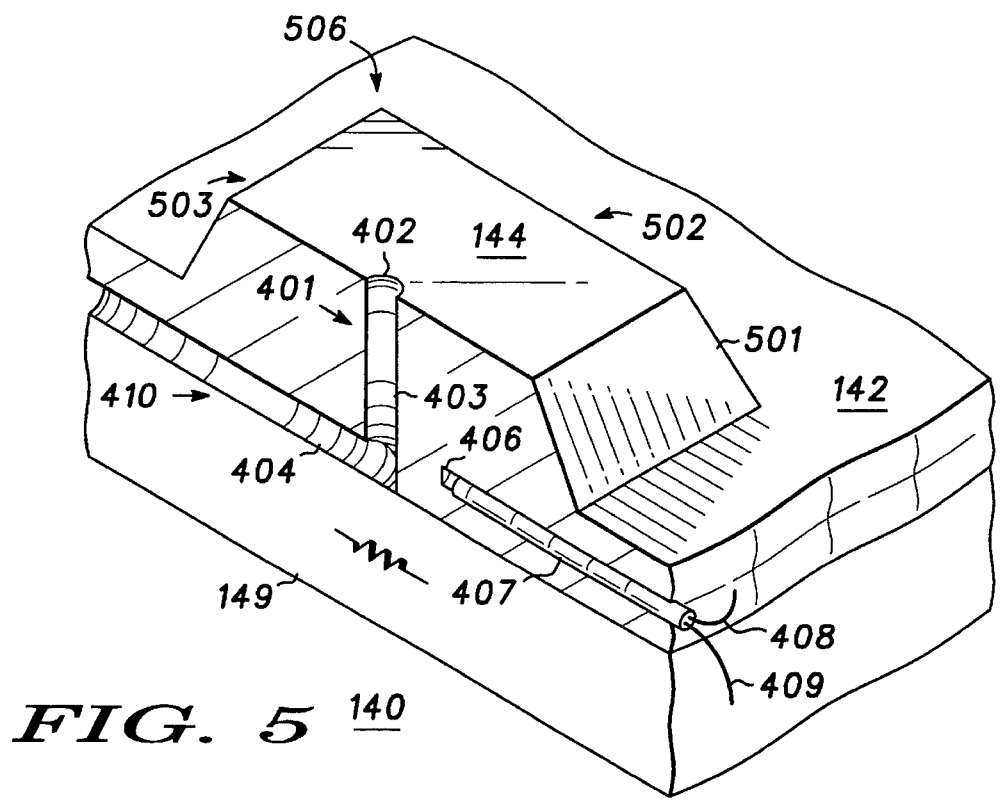
FIG. 5 is a greatly simplified isometric view of an X-ray mask heating fixture, with portions thereof removed and showing a sectional view of same.

FIG. 5 illustrates a simplified isometric view of an embodiment of a uniform heating fixture 140, with portion thereof removed, and shown in section. It should be understood that similar features identified in Figures hereinabove will retain their original identifying numerals. Generally, as seen in FIG. 5, surfaces 501, 502, 503, and another surface define a truncated pyramid shape 506 extending upwardly from surface 142. By having rectangular shape 506 extend upward from surface 142 and by having an X-ray mask having opening 107, shown hereinbefore, shaped in a rectangular opening, allows rectangular shape 506 to be inserted in the rectangular opening of the X-ray mask (shown hereinabove) so as to uniformly bake or heat membrane 103 (shown hereinabove).

Figure 6:
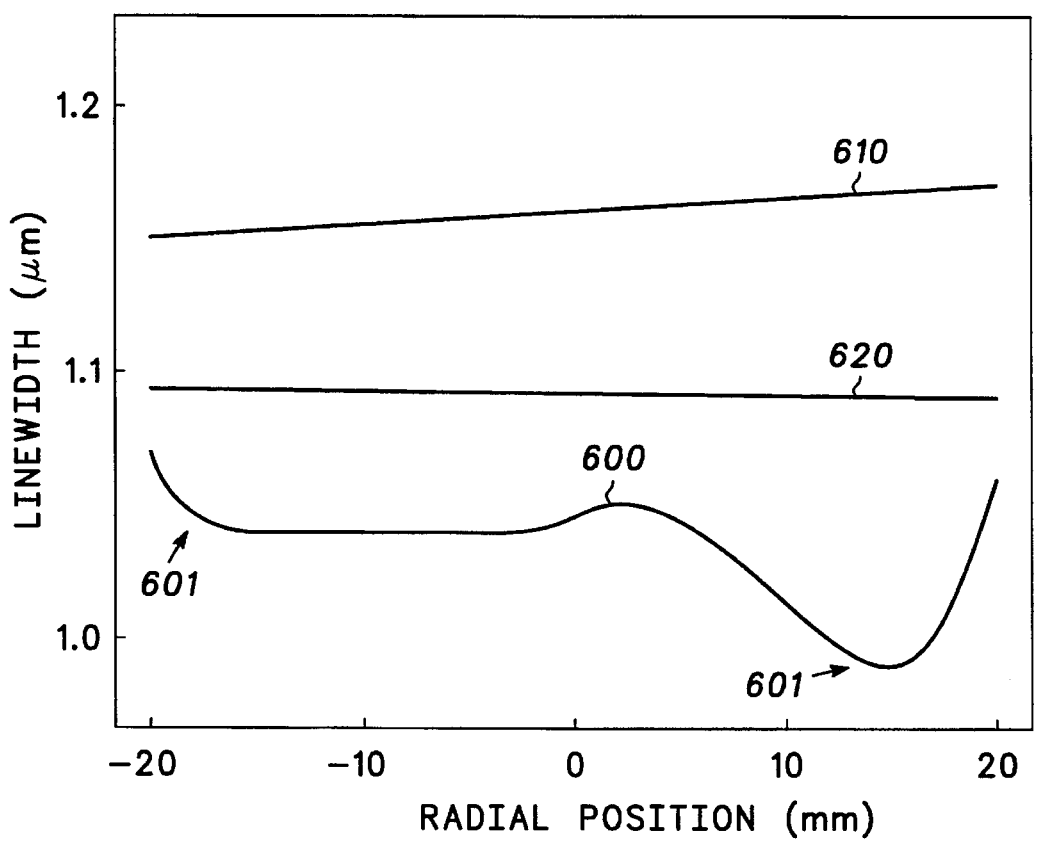
FIG. 6 is a graph showing deviation of line widths across a membrane field.

FIG. 6 is a composite graph illustrating experimental results obtained using different embodiments of uniform heating fixtures 140 shown in FIGS. 1–3. Linewidth measurements were generated with X-ray mask 100 being prepared with E-beam sensitive layer 101, SAL-601 E-beam resist, being applied on membrane 103. E-beam sensitive layer 101 was then exposed to generate features by an E-beam exposure system, post exposure baked (PEB), and developed. The developed features were then measured and plotted. Resist feature size or linewidth was plotted as a function of radial position across membrane field 150 which are represented as curve 600, 610, and 620 for FIGS. 1, 2, and 3, respectively.

Generally, conventional baking of X-ray mask 100 typically results in heating nonuniformities of greater than ten degrees Celsius across membrane field 150. While the actual variation of linewidth is dependent on resist selection, variation of chemically amplified resists baked in the convention manner can be greater than 0.2 of a micron across membrane field 150. However, in the present invention, heating nonuniformities are less than 1.0 degrees Celsius across membrane field 150, with linewidth variation of less 0.02 microns. Further, nonuniformities of 0.03 microns using the present invention are illustrated by line 620.

Line 600 is representative of measurement data obtained using uniform heating fixture 140 illustrated in FIG. 1. Although this is a significant improvement over conventional methods of baking, points 601 of line 600 vary near space 131, thereby reducing the usable chip field size.

Line 610 is representative of measurement data obtained using uniform heating fixture 140 illustrated in FIG. 2. Because both space 130 and space 131 have been reduced, the improvement in linewidth control across membrane field 150 is further improved. Line 620 is representative of data obtained using uniform heating fixture 140 illustrated in FIG. 3. Improvements in heating fixture 140 illustrated in FIG. 3, results in yet further improvements in line width uniformity across membrane field 150.

By now it should be appreciated that a novel method and article used for baking X-ray masks has been described. Baking of an X-ray mask with the present invention improves heat distribution uniformity, as well as improves linewidth uniformity and control.

We claim:

1. A uniform heating fixture in combination with an X-ray mask including a supporting ring structure defining a central opening with a membrane across an end thereof, the fixture comprising:

a heat conductive member having a first plane surface, a second surface, and a third plane surface, the first plane surface and the third plane surface being parallel and connected by the second surface, the third plane surface circumscribing and extending away from the first plane surface; and the heat conductive member extending into the central opening of the supporting ring structure and thereby positioning the first plane surface adjacent the membrane, at least one of the second surface and the third plane surface of the heat conductive member being formed and positioned to engage the supporting ring structure of the X-ray mask and position the membrane parallel with and spaced from the first plane surface.

2. A uniform heating fixture as claimed in claim 1 wherein the first plane surface describes a plane circle.

3. A uniform heating fixture as claimed in claim 2 wherein the second surface describes a concentric ring located around the plane circle.

4. A uniform heating fixture as claimed in claim 1 further including an opening in the first plane surface to provide a vent through the first plane surface.

5. A uniform heating fixture as claimed in claim 1 wherein the heat conductive member is made of a metal.

6. A uniform heating fixture as claimed in claim 5 wherein the metal includes of the following metal material: an aluminum material, a steel material, or a metal alloy material.

7. A uniform heating fixture in combination with an X-ray mask including a supporting ring structure defining a central opening with a membrane across an end thereof, the fixture comprising:

a heat conductive member having a first plane surface with an edge, a second surface with a first edge and a second edge, and a third plane surface with an edge, the third plane surface circumscribing the first plane surface and being parallel with the first plane surface, wherein the edge of the first plane surface joins the first edge of the second surface, and wherein the second edge of the second surface joins the edge of the third plane surface; and the heat conductive member extending into the central opening of the supporting ring structure and thereby positioning the first plane surface adjacent the membrane, the third plane surface of the heat conductive member being formed and positioned to engage the supporting ring structure of the X-ray mask and position the membrane parallel with and spaced from the first plane surface.

8. A uniform heating fixture as claimed in claim 7 wherein the first plane surface describes a plane circle.

9. A uniform heating fixture as claimed in claim 7 wherein the first plane surface describes a rectangle.

10. A uniform heating fixture as claimed in claim 7 further including an opening in the first plane surface to provide a vent through the first plane surface.

11. A uniform heating fixture as claimed in claim 7 wherein the heat conductive member is made of a metal.

12. A uniform heating fixture as claimed in claim 11 wherein the metal is made of one of the following metal materials: an aluminum material, a steel material, or a metal alloy material.

13. A uniform heating fixture in combination with an X-ray mask including a supporting ring structure defining a central opening with a membrane across an end thereof, the fixture comprising:

a uniform heating member having a first plane surface with an edge, a second surface with a first edge and a second edge, a third plane surface with a first edge and a second edge, and a fourth surface with an edge, the second surface being positioned substantially perpendicular to the first plane surface at the edge of the first plane surface, the third plane surface being parallel with and circumscribing the first plane surface, wherein the edge of the first plane surface joins the first edge of the second surface, wherein the second edge of the second surface joins the first edge of the third plane surface, and wherein the second edge of the third plane surface joins the edge of the fourth surface; and the heat conductive member extending into the central opening of the supporting ring structure and thereby positioning the first plane surface adjacent the membrane, the third plane surface of the heat conductive member being formed and positioned to engage the supporting ring structure of the X-ray mask and position the membrane parallel with and Spaced from the first plane surface.

* * * * *